(12) United States Patent
Popa et al.

(10) Patent No.: US 7,393,231 B2
(45) Date of Patent: Jul. 1, 2008

(54) METHODS AND APPARATUS TO FACILITATE COMPONENT INSTALLATION

(75) Inventors: Florin Popa, Mississauga (CA); Jimmy Benjamin, Georgetown (CA)

(73) Assignee: Tyco Safety Products Canada Ltd., Concord, Ontario (CA)

( * ) Notice: Subject to any disclaimer, the term of this patent is extended or adjusted under 35 U.S.C. 154(b) by 5 days.

(21) Appl. No.: 11/278,451

(22) Filed: Apr. 3, 2006

(65) Prior Publication Data
US 2007/0232112 A1 Oct. 4, 2007

(51) Int. Cl.
*H01R 13/62* (2006.01)

(52) U.S. Cl. ...................................................... 439/331

(58) Field of Classification Search ................ 439/331, 439/135, 136, 892, 142, 71, 72, 487, 344, 439/485, 73; 361/386–389, 735, 809, 820, 361/703–705, 709–712; 174/52.1
See application file for complete search history.

(56) References Cited

U.S. PATENT DOCUMENTS

| | | | |
|---|---|---|---|
| 5,363,436 A | 11/1994 | McMonagle, Jr. et al. | |
| 5,666,264 A | 9/1997 | Chandler et al. | |
| 6,194,653 B1 | 2/2001 | McMiller et al. | |
| 6,296,520 B1 * | 10/2001 | Horng | 439/607 |
| 6,492,589 B1 | 12/2002 | Smith | |
| 7,192,291 B2 * | 3/2007 | Shi et al. | 439/135 |
| 2004/0163834 A1 * | 8/2004 | Oda | 174/35 R |
| 2005/0024842 A1 | 2/2005 | Warenczak | |
| 2006/0292906 A1 * | 12/2006 | Horng | 439/135 |

* cited by examiner

*Primary Examiner*—Edwin A. León
(74) *Attorney, Agent, or Firm*—The Small Patent Law Group LLP

(57) ABSTRACT

Methods and apparatus for an electrical panel are provided. The electrical panel includes a base having a back wall with a maintenance support member provided thereon, a cover configured to be joined to the base in a closed position and separately to be supported by the base in a maintenance position. The cover and base define an enclosed chamber there between when joined in the closed position. The chamber is configured to retain electrical components. The electrical panel also includes a retention element provided on the cover, the retention element engages the maintenance support member on the base to support the cover in the maintenance position at which an interior of the chamber is open and exposed. The retention element and the maintenance support member are disengaged from one another when the base and cover are joined in the closed position.

26 Claims, 4 Drawing Sheets

METHODS AND APPARATUS TO FACILITATE COMPONENT INSTALLATION

BACKGROUND OF THE INVENTION

This invention generally relates to electrical components assembled on-site and more particularly, to methods and apparatus for facilitating installation and assembly of electrical components.

At least some known electrical control panels, for example thermostats, security system keypads, and fire detection system controls, include a base plate fixedly mounted to a surface, such as a wall. The control panel also typically includes a cover that is configured to couple to the base plate during normal operation. The cover may incorporate a keypad, control electronics, sensors and detectors, and indicators. A cable including a plurality of communication and/or power wires is channeled from the surface, through an aperture in the base plate, to the cover. The wires are terminated, for example, in a spade lug, which are then coupled to a terminal strip coupled to the cover. During installation, the installer is required to support the cover, position a spade lug on a termination of the terminal block, and tighten the termination screw to frictionally engage the spade lug in the termination. However, current keypads are difficult to assemble in this manner. Specifically, one hand is used to hold the cover and the other hand to insert the wire spade lug into the termination, which leaves no free hand to screw down the wire into the terminal block. Instead the installer often improvises a method of balancing the cover or wedging it between a part of his body and an available object, so that he frees up the use of a hand so that so that his second hand can be used to tighten the termination screw to frictionally engage the spade lug in the termination.

Some known attempts to solve the installation problem include using screwless terminal blocks, for example, spring activated terminations, to avoid the need to tighten down the wires. Others have used flying leads that the installer must solder his wires to. However, the wires not meet tightness specifications and come loose, and using flying leads requires excessive time and expertise to accomplish.

BRIEF DESCRIPTION OF THE INVENTION

In one embodiment, an electrical panel includes a base having a back wall with a maintenance support member provided thereon, a cover configured to be joined to the base in a closed position and separately to be supported by the base in a maintenance position. The cover and base define an enclosed chamber there between when joined in the closed position. The chamber is configured to retain electrical components. The electrical panel also includes a retention element provided on the cover, the retention element engages the maintenance support member on the base to support the cover in the maintenance position at which an interior of the chamber is open and exposed. The retention element and the maintenance support member are disengaged from one another when the base and cover are joined in the closed position.

In another embodiment, a method of assembling an electrical panel is provided. The electrical panel includes a base that includes a maintenance support member, and a cover that includes a retention element that is complementary to the maintenance support member. The method includes coupling the cover to the base in a maintenance position wherein the retention element engages the maintenance support member such that the cover is supported in a non-parallel orientation with respect to the base, and coupling the cover to the base in a closed position wherein the cover is supported by the base in a substantially parallel orientation with respect to the base and the retention element and the maintenance support member being disengaged from one another when the base and cover are joined in the closed position.

In yet another embodiment, an electrical panel includes a base having a back wall with a maintenance support member provided thereon, a cover configured to be joined to the base in a closed position and separately to be supported by the base in a maintenance position by a first retention means, the cover and base defining an enclosed chamber there between when joined in the closed position, the chamber being configured to retain electrical components, the chamber is open and exposed in the maintenance position, and a second retention means provided on the cover, the second retention means engaging the base to support the cover in the closed position at which the cover is substantially parallel to the base, the first retention means being disengaged when the base and cover are joined in the closed position.

DETAILED DESCRIPTION OF THE INVENTION

Figure 1:
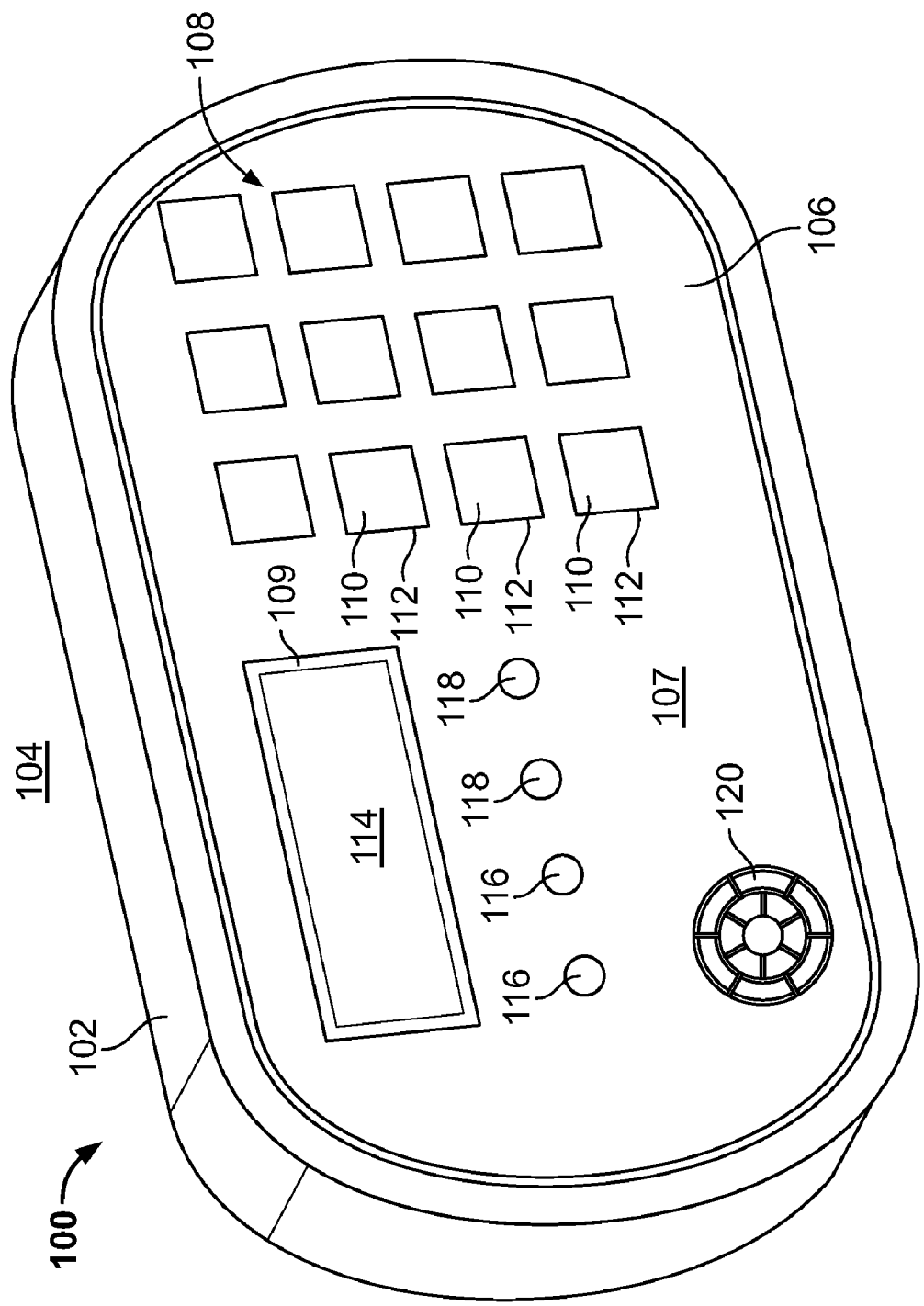
FIG. 1 is a perspective view of an exemplary electrical panel in accordance with an embodiment of the present invention.

FIG. 1 is a perspective view of an exemplary electrical panel 100 in accordance with an embodiment of the present invention. In the exemplary embodiment, electrical panel 100 includes a base 102 configured to couple to, for example, a vertical wall surface 104. Base 102 is configured to provide support for a cover 106 in a closed position wherein an enclosed chamber is formed between base 102 and cover 106. Control/interface components are positioned on an outer surface 107 of cover 106 or visible through an aperture 109 of cover 106. A keypad area 108 may be coupled to cover 106 or may be coupled to a printed circuit board (PCB) (not shown in FIG. 1). When coupled to the PCB or base 102, a plurality of keys 110 protrudes through cover 106 through a respective aperture 112. In the exemplary embodiment, the control/interface components also include a display 114, indicating lights 116, pushbuttons 118, and an aural signaling device 120. In the exemplary embodiment, cover 106 is coupled to base 102 in a closed position in an orientation that is substantially parallel to base 102. The control/interface components contained at least partially between base 102 and cover 106 may extend through apertures in cover 106 or may be visible through cover 106.

Figure 2:
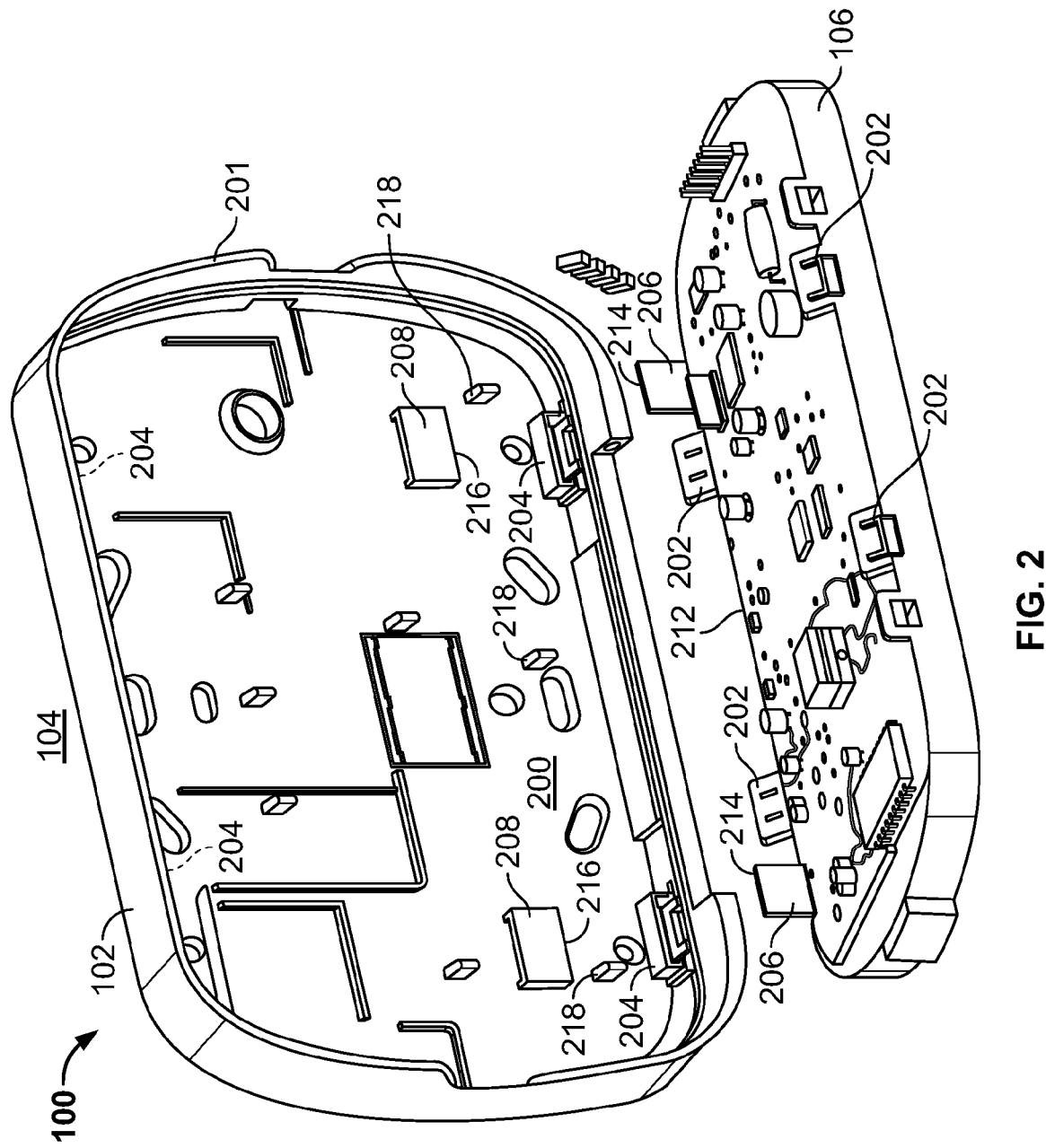
FIG. 2 is a perspective view of the electrical panel shown in FIG. 1.

FIG. 2 is a perspective view of electrical panel 100 (shown in FIG. 1). Cover 106 is illustrated completed separated from base 102 as would be the case when transitioning from the closed position (shown in FIG. 1) to a maintenance position (not shown in FIG. 2). Base 102 includes a backwall 200 and a sidewall 201 extending away from backwall 200 around an outer periphery of backwall 200. In the exemplary embodiment, cover 106 includes one or more clips 202 configured to engage sidewall 201. Engagement of clips 202 and sidewall 201 provide support for cover 106 when cover 106 is assembled to base 102 in the closed position in a substantially parallel orientation with respect to base 102 as illustrated in FIG. 1. In an alternative embodiment, a closure slot 204 on base 102 is configured to receive a retention element 206 when cover 106 is in the closed position. Cover 106 may also be secured to base 102 using a fastener such as a tamper resistant screw (not shown) when additional security is required. In the exemplary embodiment, electrical panel 100 includes retention element 206 configured to engage a maintenance support member 208 extending away from backwall 200. In an alternative embodiment, retention element 206 is positioned on base 102 and maintenance support member 208 is positioned on cover 106. In the exemplary embodiment, retention elements 206 extend away from a peripheral edge 212 of cover 106. Retention elements 206 and maintenance support members 208 are engaged in mating alignment by positioning cover 106 such that a distal end 214 of retention elements 206 are adjacent a vertically lower opening 216 of respective maintenance support members 208, inserting retention elements 206 into openings 216, and permitting cover 106 to cantilever from base 102 with cover 106 being supported by peripheral edge 212 and retention elements 206. Cantilevered cover 106 may assume a position that is perpendicular with respect to base 102 or a position at any oblique angle with respect to base 102. A friction force between peripheral edge 212 and backwall 200, and between retention elements 206 and maintenance support members 208 substantially prevents cover 106 from sliding vertically downward and disengaging retention elements 206 from maintenance support members 208. In the exemplary embodiment, base 102 also includes one or more support lands 218 extending away from backwall 200 and in alignment with cover 106 when the cover is coupled to the base plate in the first position.

Figure 3:
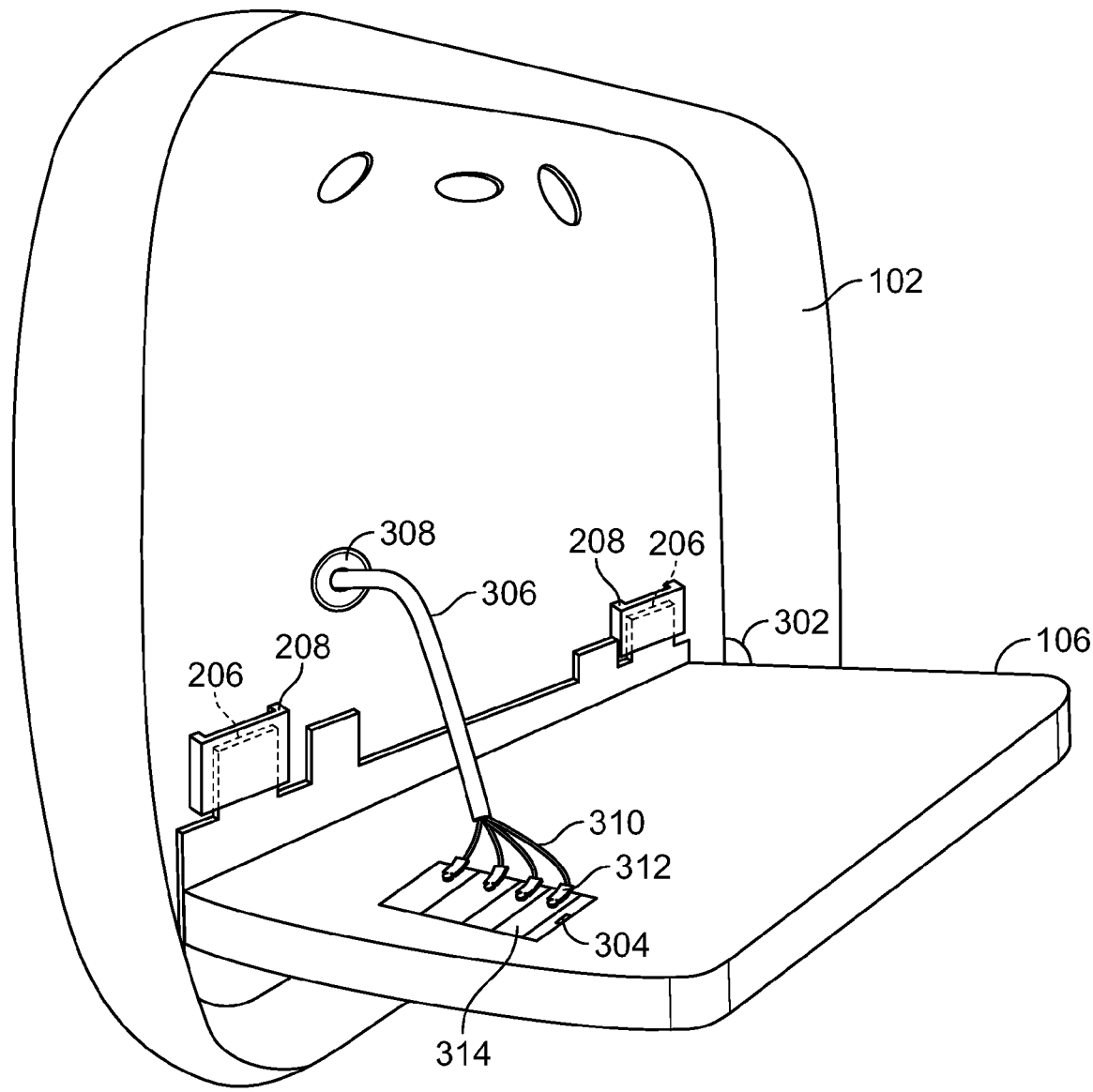
FIG. 3 is another perspective view of the electrical panel shown in FIG. 1 with the cover in the maintenance position.

FIG. 3 is another perspective view of electrical panel 100 (shown in FIG. 1). In the illustration in FIG. 3, cover 106 is shown coupled to base 102 using retention elements 206 and maintenance support members 208. In the exemplary embodiment, cover 106 extends away from base 102 at an angle 302 of approximately 90°. In various other embodiments, cover 106 extends away from base 102 at oblique angles. In the exemplary embodiment, a terminal block 304 is coupled to cover 106 and a cable 306 extends through an aperture 308 in base 102 to terminal block 304. Cable 306 includes at least one wire 310 that is terminated in a spade lug 312 or other terminal member that is configured to be coupled to a respective termination 314 on terminal block 304. Termination 314 includes a screw 316, which is tightened to frictionally engage spade lug 312 in termination 314.

Figure 4:
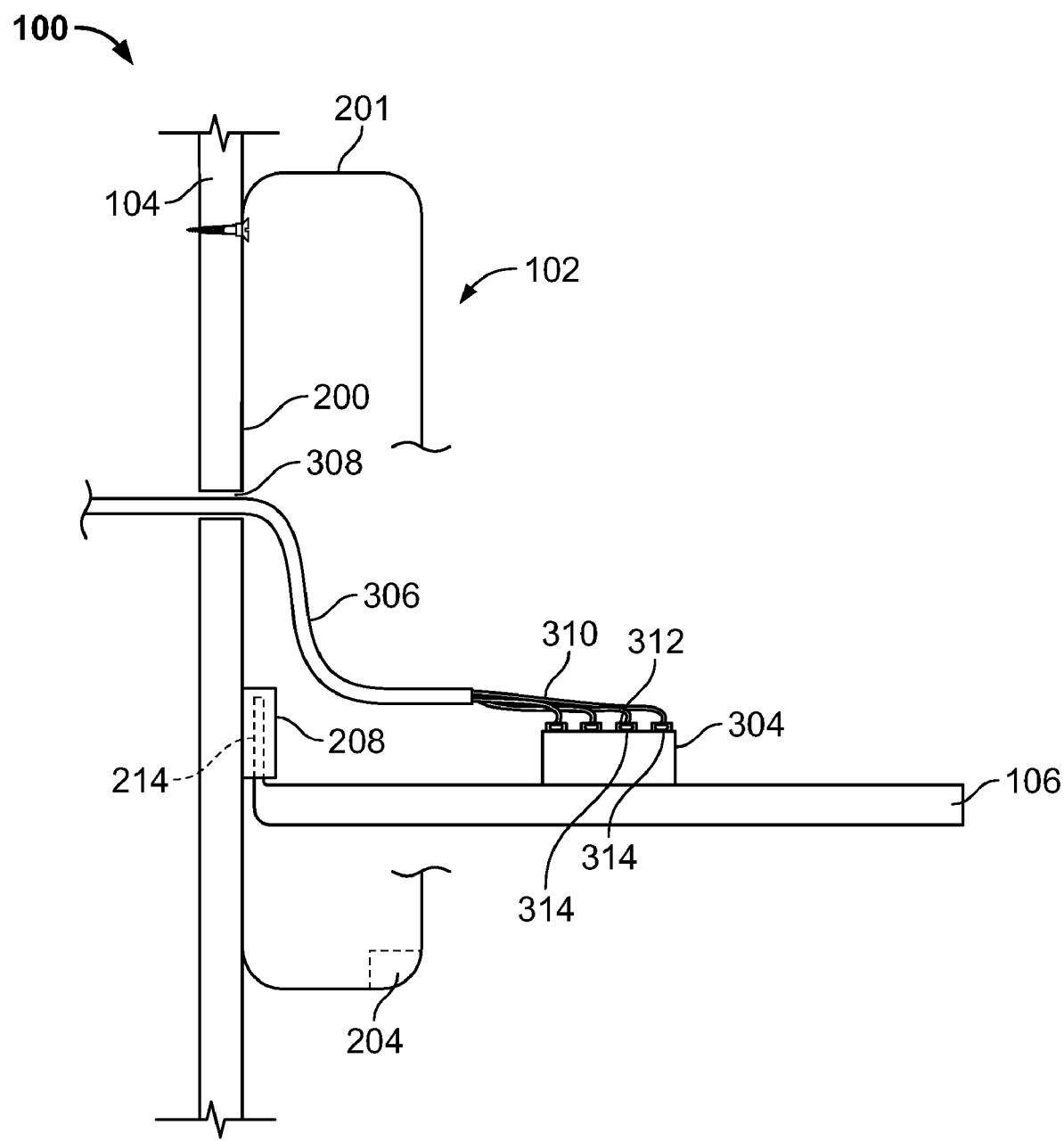
FIG. 4 is a cross-sectional side view of the electrical panel shown in FIG. 1 with the cover in the maintenance position.

FIG. 4 is a cross-sectional side view of electrical panel 100 (shown in FIG. 1). Cover 106 is shown coupled to base 102 using retention elements 206 and maintenance support members 208. In the exemplary embodiment, cover 106 extends away from base 102 at an angle 302 of approximately 90°. In various other embodiments, cover 106 extends away from base 102 at oblique angles. In the exemplary embodiment, terminal block 304 is coupled to cover 106 and cable 306 extends through aperture 308 in base 102 to terminal block 304. Cable 306 includes at least one wire 310 that is terminated in a spade lug 312 or other terminal member that is configured to be coupled to respective termination 314 on terminal block 304.

The above-described enclosure system is a cost-effective and highly reliable system for facilitating installation and assembly of a component. The tab and channel engagement that maintains a cover of the enclosure system in an accessible and stable orientation such that connections to other devices may be accomplished more simply and in less time. Accordingly, the enclosure system facilitates installation and maintenance of components, in a cost-effective and reliable manner.

While the invention has been described in terms of various specific embodiments, those skilled in the art will recognize that the invention can be practiced with modification within the spirit and scope of the claims.

What is claimed is:

1. An electrical panel, comprising:
    a base having a back wall with a maintenance support member provided thereon; and
    a cover configured to be joined to the base in a closed position and separately to be supported by the base in a maintenance position, the cover and base defining an enclosed chamber there between when joined in the closed position, the chamber being configured to retain electrical components; and
    a retention element provided on the cover, the retention element engaging the maintenance support member on the base to support the cover in the maintenance position at which an interior of the chamber is open and exposed, the retention element and the maintenance support member being disengaged from one another when the base and cover are joined in the closed position.

2. An electrical panel in accordance with claim 1 wherein said maintenance support member comprises a channel.

3. An electrical panel in accordance with claim 1 wherein said retention element comprises a substantially flat tab that is sized to fit between a portion of said maintenance support member and said back wall.

4. An electrical panel in accordance with claim 1 wherein in the closed position, said cover is configured to engage said base in a substantially parallel orientation with respect to said base.

5. An electrical panel in accordance with claim 1 wherein said cover is separated from said base when transitioning from the maintenance position to the closed position.

6. An electrical panel in accordance with claim 1, further comprising at least one of a key, a keypad, a display, an indicating light, a pushbutton, and an aural signaling device provided on the cover.

7. An electrical panel in accordance with claim 1 wherein said back wall includes a support land extending away from the back wall, said support land positioned in alignment with an edge of said cover when said cover is coupled to said base in the maintenance position.

8. An electrical panel in accordance with claim 7 wherein said support land is configured to substantially limit a downward movement of the retention element when the cover is coupled to said back wall in the maintenance position.

9. An electrical panel in accordance with claim 1, wherein the cover comprises an outer surface and the panel further comprises a control/interface component at least one of positioned on the outer surface of the cover, extending at least partially through an aperture of the cover, and visible through the cover.

10. An electrical panel in accordance with claim 9, wherein said control/interface component is configured to be connected to at least one of the electrical components for at least one of controlling and interfacing with the electrical component.

11. A method of assembling an electrical panel including a base that includes a maintenance support member, and a cover that includes a retention element that is complementary to the maintenance support member, said method comprising:
    coupling the cover to the base in a maintenance position wherein the retention element engages the maintenance support member such that the cover is supported by the base in a non-parallel orientation with respect to the base; and coupling the cover to the base in a closed position wherein the cover is supported by the base in a substantially parallel orientation with respect to the base, the retention element and the maintenance support member being disengaged from one another when the base and cover are joined in the closed position.

12. A method in accordance with claim 11 wherein coupling the cover to the base in a maintenance position comprises aligning the retention element with the maintenance support member.

13. A method in accordance with claim 11 wherein coupling the cover to the base in a maintenance position comprises suspending the cover in a cantilevered orientation from the retention element.

14. A method in accordance with claim 11 further comprising separating the cover from the base when transitioning from the maintenance position to the closed position.

15. A method in accordance with claim 11 wherein the base includes a support land extending away from the base and wherein coupling the cover to the base in a maintenance position comprises aligning an edge of the cover with the support land.

16. A method in accordance with claim 11 further comprising substantially limiting a downward movement of the retention element using a support land when the cover is coupled to the base in the maintenance position.

17. A method in accordance with claim 11, further comprising inserting the retention element into an opening of the maintenance support member from a position vertically below the maintenance support member to couple the cover to the base in the maintenance position.

18. A method in accordance with claim 11, wherein the cover includes thereon at least one of a key, a keypad, a display, an indicating light, a pushbutton, and an aural signaling device.

19. An electrical panel comprising:

a base having a back wall with a maintenance support member provided thereon; and a cover configured to be joined to the base in a closed position and separately to be supported by the base in a maintenance position by a first retention means, the cover and base defining an enclosed chamber there between when joined in the closed position, the chamber being configured to retain electrical components, the chamber is open and exposed in the maintenance position; and a second retention means provided on the cover, the second retention means engaging the base to support the cover in the closed position at which the cover is substantially parallel to the base, the first retention means being disengaged when the base and cover are joined in the closed position.

20. An electrical panel in accordance with claim 19 wherein said first retention means supports the cover in a cantilever fashion from the base.

21. An electrical panel in accordance with claim 19 wherein said cover frictionally engages the base in the closed position.

22. An electrical panel in accordance with claim 19 wherein said cover is substantially non-parallel to said base in the maintenance position.

23. An electrical panel in accordance with claim 19 wherein said cover is separated from said base when transitioning from the maintenance position to the closed position.

24. An electrical panel in accordance with claim 19 wherein said base includes a support land extending away from said base, said support land positioned in alignment with an edge of said cover when said cover is coupled to said base plate in the maintenance position, said support land is configured to substantially limit a downward movement of the first retention means when the cover is coupled to said base in the maintenance position.

25. An electrical panel in accordance with claim 19, wherein the maintenance support member comprises a channel defined between the back wall and a portion of the maintenance support member.

26. An electrical panel in accordance with claim 19, further comprising at least one of a key, a keypad, a display, an indicating light, a pushbutton, and an aural signaling device provided on the cover.

* * * * *